United States Patent
Inukai et al.

(10) Patent No.: US 7,439,893 B2
(45) Date of Patent: Oct. 21, 2008

(54) DELTA SIGMA MODULATION D/A CONVERTING SYSTEM

(75) Inventors: Fumihito Inukai, Kyoto (JP); Hitoshi Kobayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/776,748

(22) Filed: Jul. 12, 2007

(65) Prior Publication Data

US 2008/0024341 A1    Jan. 31, 2008

(30) Foreign Application Priority Data

Jul. 27, 2006    (JP) .............. 2006-204306

(51) Int. Cl.
*H03M 3/00*    (2006.01)

(52) U.S. Cl. .................... 341/143; 341/77; 341/144; 341/152

(58) Field of Classification Search ............ 341/76, 341/77, 143, 144
See application file for complete search history.

(56) References Cited

U.S. PATENT DOCUMENTS

| | | | |
|---|---|---|---|
| 4,704,600 | A | 11/1987 | Uchimura et al. |
| 4,851,841 | A | 7/1989 | Sooch |
| 5,065,157 | A | 11/1991 | Ribner et al. |
| 5,068,661 | A * | 11/1991 | Kaneaki et al. ............. 341/143 |
| 5,103,229 | A | 4/1992 | Ribner |
| 5,124,703 | A | 6/1992 | Kaneaki et al. |
| 5,550,544 | A * | 8/1996 | Sakiyama et al. ........... 341/155 |
| 5,654,711 | A | 8/1997 | Fujimori |
| 6,795,005 | B2 * | 9/2004 | Hochschild ................. 341/143 |
| 6,954,161 | B2 | 10/2005 | Inukai et al. |
| 7,084,797 | B2 | 8/2006 | Yokoyama et al. |
| 2006/0071835 | A1 | 4/2006 | Inukai |
| 2006/0164274 | A1 | 7/2006 | Nakakita et al. |

FOREIGN PATENT DOCUMENTS

| | | |
|---|---|---|
| JP | 61177818 | 8/1986 |
| JP | 02184119 | 7/1990 |
| JP | 04056407 | 2/1992 |
| JP | 04225624 | 8/1992 |
| JP | 04229722 | 8/1992 |
| JP | 7249989 | 9/1995 |
| JP | 2002158548 | 5/2002 |

(Continued)

OTHER PUBLICATIONS

U.S. Appl. No. 11/689,530 filed on Mar. 22, 2007, Yusaku Tada, et al., with claiming priority based on Japanese Application No. 2006-119679.

*Primary Examiner*—Khai M Nguyen
(74) *Attorney, Agent, or Firm*—Dickinson Wright, PLLC

(57) ABSTRACT

By using a selector, an output of a delta sigma modulator having a quantizer for quantizing a signal is selectively supplied to one of a first D/A converter having a linear amplifier and a second D/A converter having a digital amplifier. Further, the number of quantization levels of the quantizer, the sampling frequency, or the order of a transfer function of the delta sigma modulator is selected by a control signal selector in conjunction with the selector. An output of the first D/A converter is supplied to a line terminal, while an output of the second D/A converter is supplied to a headphone terminal.

12 Claims, 14 Drawing Sheets

FOREIGN PATENT DOCUMENTS

| | | |
|---|---|---|
| JP | 2005027170 | 1/2005 |
| JP | 2005136450 | 5/2005 |
| JP | 2006108892 | 4/2006 |
| JP | 2006211045 | 8/2006 |
| WO | 9641422 | 12/1996 |

* cited by examiner

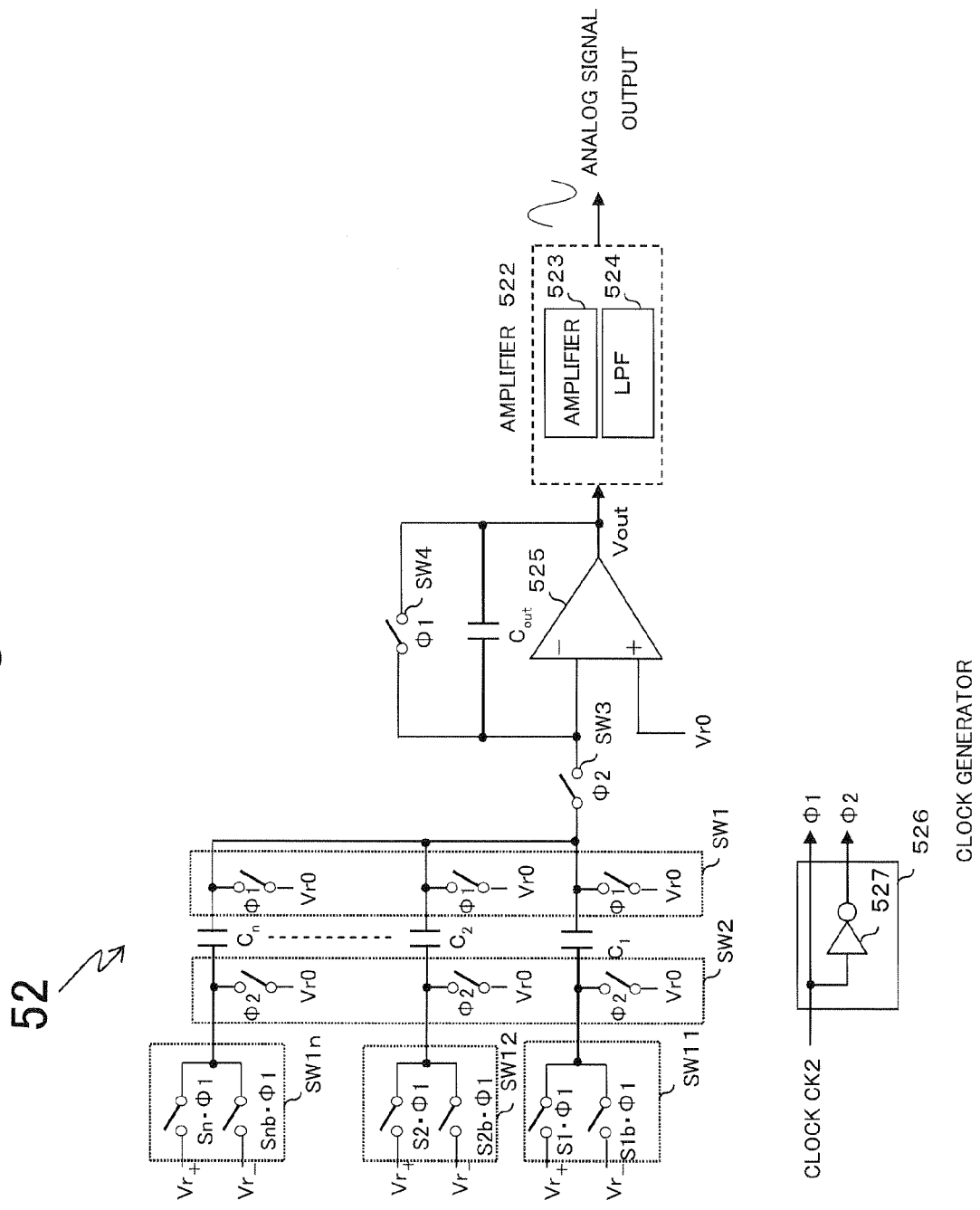

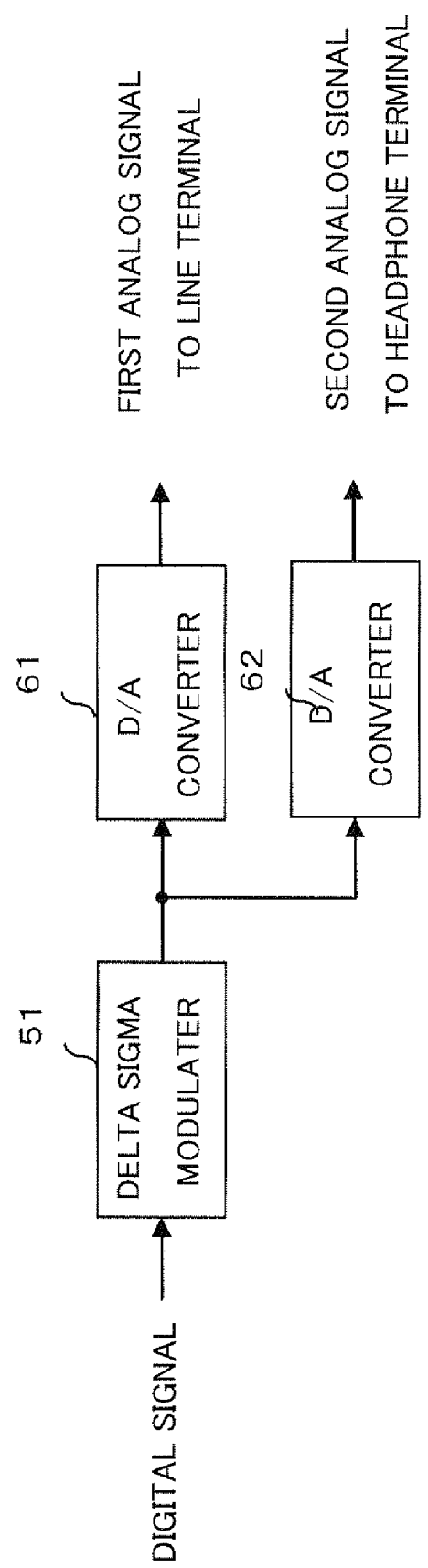

DELTA SIGMA MODULATION D/A CONVERTING SYSTEM

BACKGROUND OF THE INVENTION

1. Field of the Invention

The present invention relates to a D/A converting system for digital-to-analog converting a signal modulated by a delta sigma modulator, and in particular relates to a delta sigma modulation D/A converting system including a plurality of D/A converters.

2. Prior Art

Conventionally, a delta sigma modulation D/A converting system has been known as a high resolution D/A converting system, and such a delta sigma modulation D/A converting system has been used in digital audio equipment or the like.

FIG. 6 is a block diagram showing a configuration of a prior-art delta sigma modulation D/A converting system.

A digital signal is inputted to a delta sigma modulator 51 and is modulated into a PDM (Pulse Density Modulation) signal in which data of more than ten bits is bit-compressed to several bits. The PDM signal is then inputted to a D/A converter 52 and is outputted therefrom as an analog signal. Furthermore, a clock generator 73 supplies a clock CK1 and a clock CK 2 to the delta sigma modulator 51 and the D/A converter 52, respectively.

As a configuration example of the delta sigma modulator 51, a block diagram of a cascade delta sigma modulator is shown in FIG. 7. The cascade delta sigma modulator includes: a main loop 1 and a sub-loop 2 operated at a sampling frequency determined by the clock CK1 supplied from the clock generator 73; and a noise removal section 3. The sampling frequency is normally set sufficiently higher than the frequency of a digital input signal (i.e., set at about 16 to about 64 times as much as the frequency of a digital input signal).

The main loop 1 includes an adder 4, a local quantizer 5, a subtractor 6, and a delay device 7. A digital signal X is added to a feedback signal sent via the delay device 7 by the adder 4, and is bit-compressed to a predetermined level by the local quantizer 5. If a quantization error, which occurs due to the bit compression of the local quantizer 5, is defined as Q1, an output of the subtractor 6 becomes −Q1, and a transfer function of an output Y1 from the main loop 1 is expressed as the following equation:

$$Y1 = X + (1-Z^{-1}) \cdot Q1 \qquad (1)$$

On the other hand, the sub-loop 2 includes an adder 8, a local quantizer 9, a subtractor 10, and an integrator 11. A signal inputted to the sub-loop 2 (=−Q1) is added to a feedback signal returned via the integrator 11 by the adder 8, and is bit-compressed to a predetermined level by the local quantizer 9. If a quantization error, which occurs due to the bit compression of the local quantizer 9, is defined as Q2, an output of the subtractor 10 becomes −Q2. Accordingly, if a transfer function of the integrator 11 is defined as H (Z), a transfer function of an output Y2 from the sub-loop 2 is expressed as the following equation:

$$Y2 = -Q1 + (1-H(Z)) \cdot Q2$$

The output Y2 from the sub-loop 2 is differentiated by a differentiator 13 in the noise removal section 3, and is added to the output Y1 of the main loop 1 by an adder 12. Accordingly, a final output Y of the delta sigma modulator is expressed as the following equation:

$$Y = Y1 + (1-Z^{-1}) \cdot Y2 \qquad (2)$$
$$= X + (1-Z^{-1}) \cdot (1-H(Z)) \cdot Q2$$

If the number of quantization levels of the local quantizer 5 is 7-value while the number of quantization levels of the local quantizer 9 is 3-value, for example, the local quantizers 5 and 9 carry out quantization as shown in Table 1 and Table 2. It should be noted that the output is standardized at 16384.

TABLE 1

| Input | Output |
|---|---|
| 28160 or more | +3 |
| 16896 to 28159 | +2 |
| 5632 to 16895 | +1 |
| −5632 to 5631 | 0 |
| −16896 to −5633 | −1 |
| −28160 to −16897 | −2 |
| −28161 or less | −3 |

TABLE 2

| Input | Output |
|---|---|
| 5632 or more | +1 |
| −5632 to 5632 | 0 |
| −5633 or less | −1 |

If the numbers of quantization levels of the local quantizers 5 and 9 are defined as L1 and L2, respectively, while a quantization noise per unit of quantization level of the local quantizer 9 is defined as E2, then the quantization error Q2 of the local quantizer 9 can be expressed as follows: Q2=E2/(L1+L2). Therefore, if this equation is substituted into Equation (2), the output Y of the delta sigma modulator is expressed as the following equation:

$$Y = X + (1-Z^{-1}) \cdot (1-H(Z)) \cdot E2/(L1+L2) \qquad (3)$$

Next, a specific configuration of the integrator 11 will be described below. FIG. 8 is a block diagram of the integrator 11. An input (−Q2) is supplied to a delay circuit 21, and is shifted to delay circuits 22 through 24 in sequence. Outputs of the delay circuits 21 through 24 are multiplied k1-fold, k2-fold, k3-fold and k4-fold by multipliers 29 through 32, respectively, while outputs of delay circuits 25 through 28 are multiplied a-fold, b-fold, c-fold and d-fold by multipliers 33 through 36, respectively. Then, adders 37 through 43 add the outputs of the delay circuits 21 through 24 to the outputs of the delay circuits 25 through 28, and output the resulting values, which are to be inputted to the delay circuit 25.

Therefore, a transfer function H (Z) of the integrator 11 is expressed as the following equation:

$$H(Z) = (k1 \cdot Z^{-1} + k2 \cdot Z^{-2} + k3 \cdot Z^{-3} + k4 \cdot Z^{-4})/(1 + a \cdot Z^{-1} + b \cdot Z^{-2} + c \cdot Z^{-3} + d \cdot Z^{-4}) \qquad (4)$$

If Equation (4) is substituted into Equation (3), the output Y of the delta sigma modulator is expressed as the following equation:

$$Y = X + (1-Z^{-1}) \cdot (1+(a-k1) \cdot Z^{-1} + (b-k2) \cdot Z^{-2} + (C-k3) \cdot Z^{-3} + (d-k4) \cdot Z^{-4})/((1+a \cdot Z^{-1} + b \cdot Z^{-2} + c \cdot Z^{-3} + d \cdot Z^{-4}) \cdot E2/(L1+L2) \qquad (5)$$

Furthermore, it can be seen from Equations (4) and (5) that the order of the integrator 11, i.e., the order of a transfer function of the delta sigma modulator, is determined by the values of factors k1, k2, k3, k4, a, b, c, and d of the multipliers 29 through 36.

Table 3 shows exemplary settings for the factors of the integrator 11 and the order of a transfer function of the delta sigma modulator. Furthermore, the transfer function of the delta sigma modulator in the case where each factor is substituted into the integrator 11 is expressed as Equations (6) through (8) as follows:

$$Y=X+(1-Z^{-1})^3 \cdot E2/(L1+L2) \qquad (6)$$

$$Y=X+(1-Z^{-1})^4/(1-Z^{-1}+0.5Z^{-2}) \cdot E2/(L1+L2) \qquad (7)$$

$$Y=X+(1-Z^{-1})^5/(1-2Z^{-1}+2Z^{-2}) \cdot E2/(L1+L2) \qquad (8)$$

TABLE 3

| | | | Factor | | | | | Delta Sigma |
|---|---|---|---|---|---|---|---|---|
| Eq | a | b | c | d | k1 | k2 | k3 | K4 | Order |
| (6) | 0 | 0 | 0 | 0 | 2 | −1 | 0 | 0 | 3 |
| (7) | −1 | 0.5 | 0 | 0 | 2 | −2.5 | 1 | 0 | 4 |
| (8) | −2 | 2 | 0 | 0 | 2 | −4 | 4 | −1 | 5 |

Now, consideration will be given to a dynamic range of a delta sigma modulator. The dynamic range is expressed as a ratio between a maximum amplitude of an input signal X and a quantization noise level. For example, if the maximum amplitude of the input signal X is defined as Xmax in the case of Equation (6), the dynamic range is expressed as the following equation:

$$\text{Dynamic range}=X\text{max}/\{(1-Z^{-1})^3 \cdot E2/(L1+L2)\} \qquad (9)$$

Based on this result, it can be seen that the higher the numbers of quantization levels (L1, L2) of the local quantizers 5 and 9 and the order of the integrator 11, the more likely it is that a high dynamic range can be realized. However, the delta sigma modulator forms a feedback loop; therefore, if a large amplitude is inputted in the loop, there arises the problem that it becomes impossible to catch up with the feedback, resulting in unfavorable oscillation. In addition, the higher the order of the transfer function, the slower the response of a feedback signal to the input signal, thus making it more likely to cause the oscillation. Accordingly, even if the order of the transfer function is excessively increased in order to increase the dynamic range, the allowable input amplitude is limited, thus conversely reducing the dynamic range.

To cope with these problems, in a high-order delta sigma modulator, a method for increasing the number of levels of a quantizer to raise the speed of a feedback response is used.

Further, as a means of increasing the dynamic range (D-range) of the delta sigma modulator, a method for increasing the sampling frequency to raise the over-sampling rate (OSR) with respect to the frequency of the input signal X is also used.

Next, in giving consideration to a delta sigma modulator used in a delta sigma modulation D/A converting system, a percentage modulation is an important item. The percentage modulation represents a ratio between a maximum amplitude of an output Y and a maximum amplitude of an input signal X. As a specific example, consideration will be given to the percentage modulation of the cascade delta sigma modulator shown in FIG. 7. If the number of quantization levels of the local quantizer 5 in the main loop 1 is defined as L1, and the number of quantization levels of the quantizer 9 in the sub-loop 2 is defined as L2, then the maximum amplitude of the output Y1 and the maximum amplitude of the output Y2 are represented by L1 and L2, respectively. Furthermore, L2 is expressed as 2(L2−1) after having passed through the differentiator 13. Accordingly, a maximum amplitude Ymax of the output Y is expressed as the following equation:

$$Y\text{max}=(L1-1)+2(L2-1) \qquad (10)$$

In this case, the maximum amplitude Xmax of the input signal X is expressed as the following equation:

$$X\text{max}=L1-1 \qquad (11)$$

Therefore, the percentage modulation is expressed as follows:

$$\text{Percentage modulation} = X\text{max}/Y\text{max} \qquad (12)$$
$$= (L1-1)/(L1-1)+2(L2-1)$$
$$= (L1-1)/(L1+2L2-3)$$

As a result, if L1=9-value and L2=3-value, then the percentage modulation=0.67. Further, it can be seen that, in the delta sigma modulator shown in FIG. 7, the smaller the number L1 of quantization levels of the local quantizer 5 in the main loop 1, the lower the percentage modulation.

Comparative results showing the relationships among the number of quantization levels, OSR, percentage modulation and D-range are exemplarily shown in Table 4 below. In this example, a fourth-order delta sigma modulator is used, and the final output level L(=L1+2L2−2) of the delta sigma modulator is also shown in Table 4.

TABLE 4

| Quantization Level | OSR [-fold] | Percentage Modulation [%] | D-range [dB] |
|---|---|---|---|
| L1 = 5 – value | 16 | 50 | 85 |
| L2 = 3 – value | 32 | | 113 |
| L = 7 – value | 64 | | 140 |
| L1 = 7 – value | 16 | 60 | 88 |
| L2 = 3 – value | 32 | | 115 |
| L = 9 – value | 64 | | 142 |
| L1 = 9 – value | 16 | 67 | 90 |
| L2 = 3 – value | 32 | | 117 |
| L = 13 – value | 64 | | 144 |

Next, a configuration of the D/A converter 52 used in the delta sigma modulation D/A converting system will be described with reference to FIG. 9. The D/A converter 52 includes: a PWM (Pulse Width Modulation) section 521 operated at a frequency determined by the clock CK2 supplied from the clock generator 73; and an amplifier section 522. A multi-valued PDM signal outputted from the delta sigma modulator is converted into a binary PWM signal by the PWM section 521, and is inputted to the amplifier section 522.

The amplifier section 522 includes an amplifier 523 and an LPF (low-pass filter) 524. The PWM signal inputted to the amplifier section 522 is amplified by the amplifier 523, has its high-frequency component removed by the LPF 524, and is outputted as an analog signal.

FIG. 10 shows the relationship between the PDM signal and the output of the PWM signal in the case where a 7-value PDM signal is inputted to the PWM section 521. The 7-value PDM signal is developed along the time axis at a clock frequency six times as much as the sampling frequency of the delta sigma modulator, and is converted into a binary signal.

In other words, the clock frequency of the PWM signal is determined by the product of the sampling frequency and the number of quantization levels of the delta sigma modulator.

The amplifier section 522 used in a D/A converter can be classified into several types depending on a configuration of an output stage thereof, as typified by a linear amplifier and a digital amplifier. As a linear amplifier, a class A amplifier, a class B amplifier or a class AB amplifier is well known, and a digital amplifier is also called a "class D amplifier". A linear amplifier is advantageous in that the output amplitude can be increased, but is disadvantageous in that the thermal efficiency is unfavorably low. On the other hand, a digital amplifier is advantageous in that the thermal efficiency is high, but is disadvantageous in that the output amplitude is unfavorably reduced since the output amplitude is limited by the percentage modulation.

FIG. 11 shows a configuration of a class AB linear amplifier. A PWM signal, first, has its high-frequency component removed by an LPF 524, and is inputted to an amplifier 523. The signal inputted to the amplifier 523 is amplified and converted into a differential signal at a drive stage 611, and then drives an output transistor of a class AB output stage 612.

To the contrary, in a digital amplifier shown in FIG. 12, a PWM signal is, first, inputted to a drive stage 613 of an amplifier 523, and then drives an output transistor of a class D output stage 614. Thereafter, the signal has its high-frequency component removed by an LPF 524 consisting of a low-loss LC filter.

In the class AB amplifier, it is necessary to flow a bias current through the output stage so as not to cause distortion. On the other hand, in the class D amplifier, although an electric current momentarily flows through the output transistor when it is switched from ON to OFF or from OFF to ON, no electric current flows therethrough after the transistor has been switched to ON or OFF; therefore, the loss (heat generation) at the output stage is low, thus making it possible to realize a high efficiency.

Furthermore, in the class D amplifier, the PWM signal is outputted as it is, and therefore, the maximum output amplitude of an analog signal is determined by the percentage modulation of the output stage. Accordingly, when the output power is desired to be increased, it is necessary to increase the number of quantization levels of the delta sigma modulator, and to raise the percentage modulation. However, as already described with reference to FIG. 10, the clock frequency of the PWM signal is determined by the product of the sampling frequency and the number of quantization levels of the delta sigma modulator, and therefore, the clock frequency of the PWM signal is raised if the number of quantization levels is increased. If the clock frequency of the PWM signal is raised, it becomes susceptible to clock jitter or waveform rounding, which appears as waveform distortion or noise after having been converted into an analog signal. In general, the clock frequency of the PWM signal is preferably set at 10 MHz or less; therefore, to cope with the above-mentioned problem, it is necessary to decrease the sampling frequency in accordance with an increase in the number of quantization levels of the delta sigma modulator.

In the case where the class AB amplifier is used, as a configuration of a D/A converter, a switched capacitor D/A converter may be used as shown in FIG. 13. The switched capacitor D/A converter includes: capacitative elements C1 through Cn; switches SW1 through SW4 and SW11 through SW1n; an operational amplifier 525; and a clock generator 526. Furthermore, the clock generator 526 generates a clock $\Phi 1$, and a clock $\Phi 2$ that has been inverted from the clock $\Phi 1$ by an inverter 527. A PDM signal outputted from the delta sigma modulator is supplied to the switches SW11 through SW1n, and the number (=n) of the switches is equal to the number of levels of the PDM signal.

The switches SW1 and SW4 each enter a closed state when the clock $\Phi 1$ is at a high level, and enter an open state when the clock $\Phi 1$ is at a low level. Further, when digital data of respective levels of the PDM signal are defined as S1 through Sn, the switches SW11 through SW1n are connected to any of reference voltage sources ($Vr_+$, $Vr_-$) in accordance with the polarities (high or low) of the data S1 through Sn. Furthermore, the reference characters S1b through Snb represent inversion signals of the data S1 through Sn.

Accordingly, when the clock $\Phi 1$ is at a high level (i.e., when the clock $\Phi 2$ is at a low level), the left sides of the capacitative elements C1 through Cn are connected to the reference voltage sources $Vr_+$ or $Vr_-$ in accordance with the polarities of the digital data S1 through Sn, while the right sides of the capacitative elements C1 through Cn are connected to reference voltage sources Vro, thus allowing electric charges to be stored in the capacitative elements C1 through Cn. In this case, since the switch SW4 is also in a closed state, both ends of a capacitor Cout are short-circuited, and electric charges stored in the capacitor Cout are discharged.

Next, when the clock $\Phi 2$ is at a high level (i.e., when the clock $\Phi 1$ is at a low level), the switches SW2 and SW3 each enter a closed state while the switches SW1 and SW4 each enter an open state. In this case, the left sides of the capacitative elements C1 through Cn are connected to the reference voltage sources Vro while the right sides of the capacitative elements C1 through Cn are also each connected to the reference voltage source Vro since it serves as a virtual ground point of the operational amplifier 525. Thus, due to charge conservation, the electric charges stored in the capacitative elements C1 through Cn are transferred to the capacitor Cout, and are presented as an output Vout of the operational amplifier 525. If the following equation: $Vr_+ - Vro = Vro - Vr_- = Vr$ is true, the output Vout of this switched capacitor D/A converter is expressed as the following equation:

$$Vout = \{Vr \cdot (S1 \cdot C1 + S2 \cdot C2 + \ldots + Sn \cdot Cn) - Vr \cdot (S1b \cdot C1 + S2b \cdot C2 + \ldots + Snb \cdot Cn)\} / Cout \quad (13)$$

The clock $\Phi 2$, $\overline{\Phi 2}$ (CK2) supplied to the switched capacitor D/A converter is normally used as a value equivalent to the sampling frequency of the delta sigma modulator. Therefore, unlike the configuration using PWM, the switched capacitor D/A converter has an advantage that it is unnecessary to decrease the sampling frequency even if the number of quantization levels of the delta sigma modulator is increased.

A D/A converting system intended for digital audio equipment, in particular portable equipment, is often required to output two types of analog audio signals to two terminals, i.e., a line terminal and a headphone terminal, and in such a case, this system is configured as shown in FIG. 14. A digital signal is inputted to a delta sigma modulator 51, and is modulated into a PDM signal. The PDM signal is inputted to D/A converters 61 and 62, and outputted therefrom as a first analog signal and a second analog signal. The first and second analog signals are connected to a line terminal and a headphone terminal, respectively. For an output to the headphone terminal, a relatively high power of about 40 mW is required at a load of 16Ω, and therefore, a digital amplifier with a high thermal efficiency is suitable as an amplifier section of the D/A converter 62. On the other hand, for an output to the line terminal, a high dynamic range is required; however, the output power is as low as 1 mW or less, which makes the efficiency negligible, and therefore, a linear amplifier capable of increasing the output amplitude is suitable as an amplifier section of the D/A converter 61. Accordingly, a linear amplifier is preferably used in the amplifier section of the D/A converter 61 in FIG. 14, while a digital amplifier is preferably used in the amplifier section of the D/A converter 62 in FIG. 14.

The problem in this case is that the specifications of a linear amplifier and a digital amplifier required for the delta sigma modulator are different. In a digital amplifier, the percentage modulation of the delta sigma modulator has to be increased as much as possible as already described above. To the contrary, in a linear amplifier, the percentage modulation is negligible because the output signal amplitude can be adjusted at a drive stage; whereas, in the case of the use for a line terminal, a dynamic range of 16-bit accuracy (i.e., 98 dB) or more is required.

However, in the conventional delta sigma modulation D/A converting system shown in FIG. 14, only one delta sigma modulator is used; therefore, for example, the description will be made with reference to Table 4 shown above as follows. If the number of quantization levels is set at 13-value in order to make the delta sigma modulator suitable for a digital amplifier, the percentage modulation is 67%, and thus the output power for the headphone terminal is about 40 mW (at a load of 16Ω and a supply voltage of 3.3V). In this case, if an attempt is made to set the clock frequency of the PWM signal at 10 MHz or less while the number of quantization levels is 13-value, the sampling frequency of the delta sigma modulator has to be set at 770 kHz or less. Since a digital signal is inputted at 44.1 kHz, the allowable over-sampling rate is 16 times or less. Therefore, the theoretical value of the dynamic range of the delta sigma modulator is merely 90 dB, which cannot satisfy the performance requirements of the line terminal.

A method for increasing the dynamic range by increasing the order of a transfer function of the delta sigma modulator may be used; however, as already mentioned above, if the order of the transfer function is excessively increased, oscillation is likely to occur when a large amplitude is inputted, which conversely reduces the dynamic range.

On the other hand, if the over-sampling rate is set at 32 times in order to make the delta sigma modulator suitable for a linear amplifier, the number of quantization levels allowable by the clock frequency of the PWM signal is 7-value or less, and thus the percentage modulation is 50%. If the resultant PDM signal is used for a headphone terminal as an output of a class D amplifier, an output power of merely about 20 mW is achieved.

To cope with these problems, one delta sigma modulator may be provided exclusively to one D/A converter in which a class AB amplifier is used, while another delta sigma modulator may be provided exclusively to another D/A converter in which a class D amplifier is used. However, in such a case, there arises a new problem that the power consumption and circuit size are nearly doubled.

SUMMARY OF THE INVENTION

It is therefore an object of the present invention to provide a delta sigma modulation D/A converting system capable of generating a delta sigma modulated signal optimal for an amplifier configuration of a D/A converter selected from among a plurality of D/A converters, and improving the performance of an amplifier output signal.

To achieve the above object, a first delta sigma modulation D/A converting system according to the present invention includes: a delta sigma modulator that has a quantizer for quantizing a signal, in which the number of quantization levels is selectable, and that is operated at a predetermined sampling frequency; at least one first D/A converter that has a linear amplifier, and that receives an output of the delta sigma modulator; at least one second D/A converter that has a digital amplifier, and that receives an output of the delta sigma modulator; first selecting means for selectively activating one of the at least one first D/A converter and the at least one second D/A converter; and second selecting means for selecting the number of quantization levels of the quantizer in conjunction with the first selecting means.

Further, a second delta sigma modulation D/A converting system according to the present invention includes: a delta sigma modulator that allows the order of a transfer function to be selectable, and that is operated at a predetermined sampling frequency; at least one first D/A converter that has a linear amplifier, and that receives an output of the delta sigma modulator; at least one second D/A converter that has a digital amplifier, and that receives an output of the delta sigma modulator; first selecting means for selectively activating one of the at least one first D/A converter and the at least one second D/A converter; and second selecting means for selecting the order of a transfer function of the delta sigma modulator in conjunction with the first selecting means.

According to this configuration, the number of quantization levels or the order of a transfer function of the delta sigma modulator is selected in accordance with an amplifier configuration of the selected D/A converter, thus making it possible to generate a delta sigma modulated signal optimal for the amplifier configuration of the selected D/A converter, and to improve the performance of an amplifier output signal.

In the above configuration, the inventive delta sigma modulation D/A converting system preferably further includes third selecting means for selecting the sampling frequency of the delta sigma modulator in conjunction with the first selecting means.

Such configuration makes it possible to generate a more optimal delta sigma modulated signal, and to further improve the performance of an amplifier output signal.

Furthermore, in the above configuration, the at least one first D/A converter and the at least one second D/A converter preferably each have a PWM converter operated at a predetermined sampling frequency, and the inventive system preferably further includes fourth selecting means for selecting the sampling frequency of the PWM converter in conjunction with the first selecting means.

Such configuration makes it possible to change the number of quantization levels while the sampling frequency of the delta sigma modulator is kept constant, because the sampling frequency of the PWM converter is determined in proportion to the product of the sampling frequency and the number of quantization levels of the delta sigma modulator.

Moreover, in the above configuration, the first selecting means comprises of a selector for selectively supplying an output of the delta sigma modulator to one of the at least one first D/A converter and the at least one second D/A converter.

In addition, in the above configuration, the first selecting means may be a power controller for supplying an operating bias current to one of the at least one first D/A converter and the at least one second D/A converter, and for stopping the supply of the bias current to the other D/A converter(s).

Such configuration can suppress power consumption because the supply of the bias current to the unused one of the first and second D/A converters is shut off.

As described above, the present invention relates to a delta sigma modulation D/A converting system including a delta sigma modulator and a plurality of D/A converters. The present invention can implement the delta sigma modulation D/A converting system in which the number of quantization levels, the sampling frequency, or the order of a transfer function of the delta sigma modulator is selected in accordance with an amplifier configuration of the selected D/A converter, thereby making it possible to generate a delta sigma modulated signal optimal for the amplifier configuration of the selected D/A converter, and to improve the performance of an amplifier output signal.

BRIEF DESCRIPTION OF THE DRAWINGS

FIG. 13 is a block diagram of a switched capacitor D/A converter.

FIG. 14 is a block diagram of a delta sigma modulation D/A converting system according to another conventional example.

DESCRIPTION OF THE PREFERRED EMBODIMENTS

Embodiment 1

Figure 1:
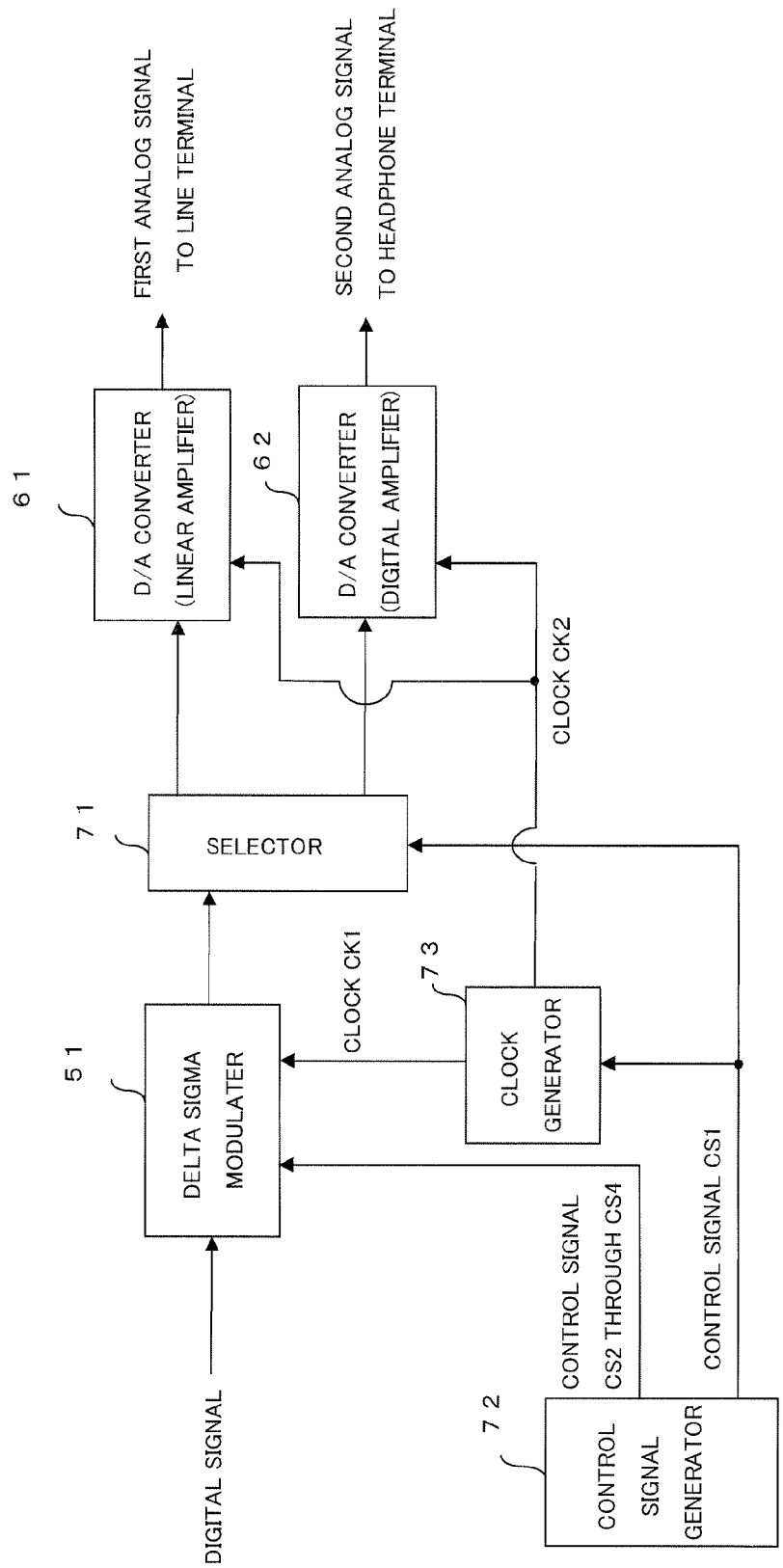
FIG. 1 is a block diagram of a delta sigma modulation D/A converting system according to Embodiment 1 of the present invention.

FIG. 1 shows Embodiment 1 of the present invention. A digital signal is inputted to a delta sigma modulator 51 in which the data of more than ten bits is modulated into a PDM signal of several bits, and then the PDM signal is inputted to a selector 71. In response to a control signal CS1 outputted from a control signal generator 72, the selector 71 (equivalent to a first selecting means) selects the inputted PDM signal to be outputted to a D/A converter 61 or to a D/A converter 62.

Figure 11:
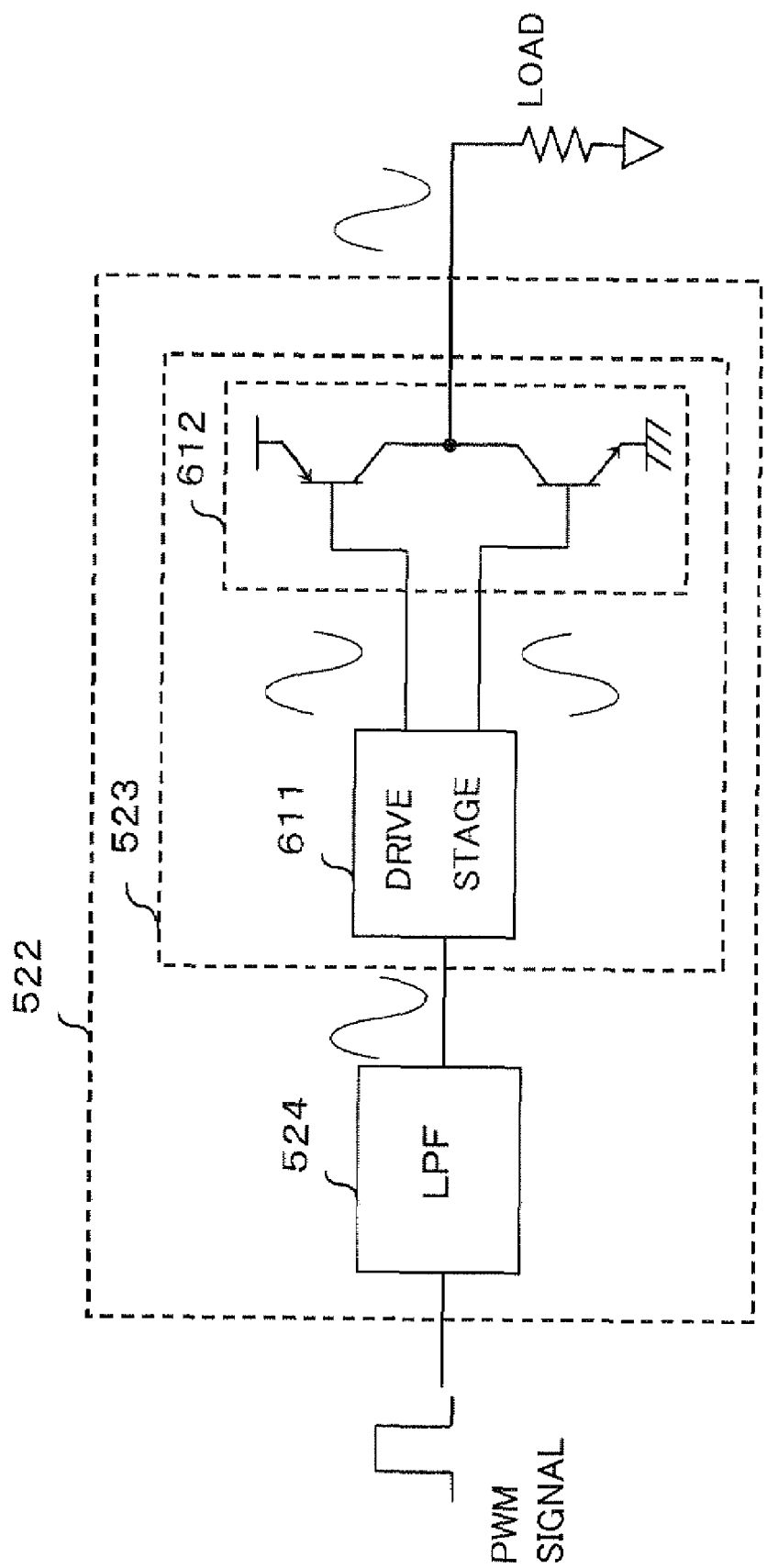
FIG. 11 is a block diagram of a class AB amplifier section.
Figure 12:
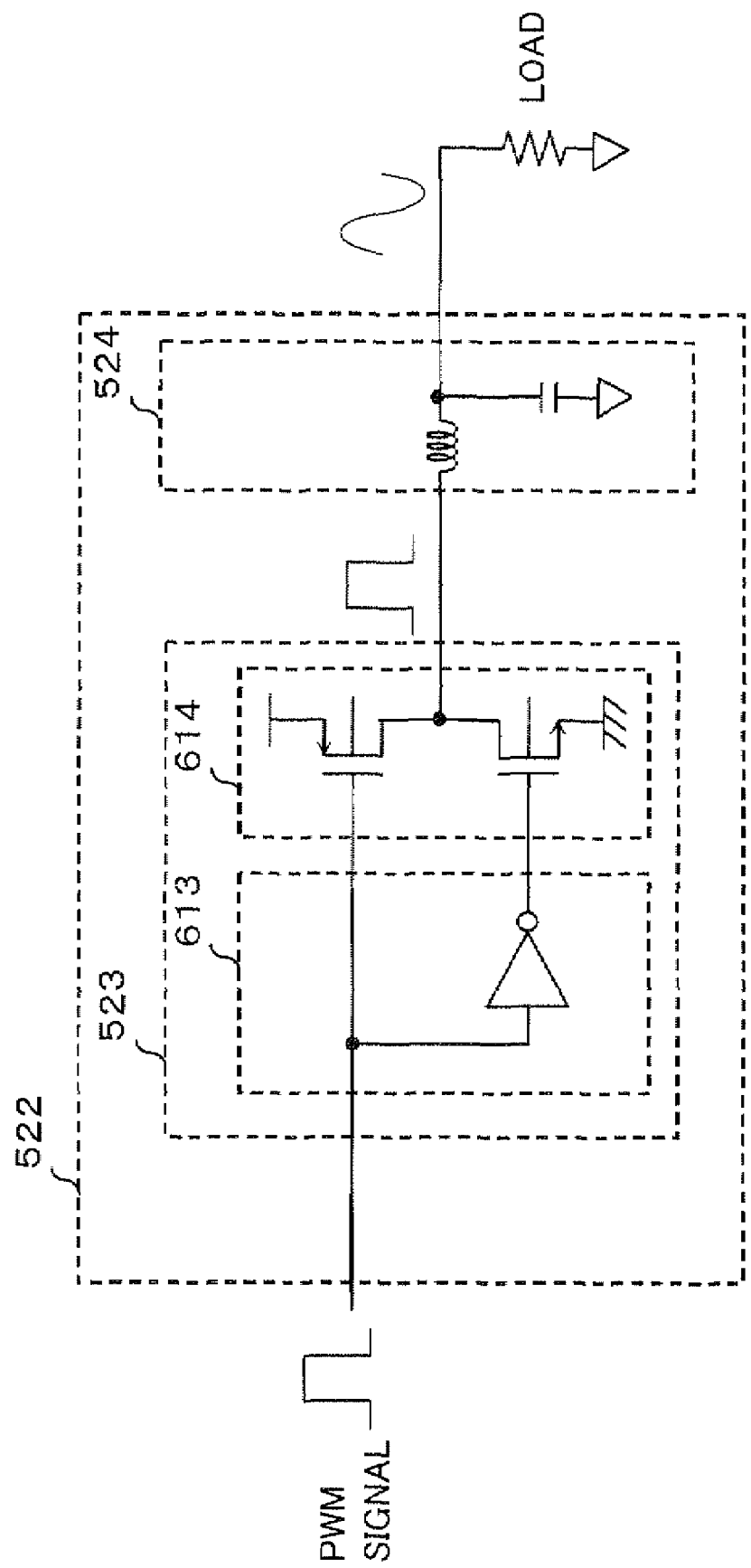
FIG. 12 is a block diagram of a class D amplifier section.

The D/A converter 61 has a class AB linear amplifier shown in FIG. 11, while the D/A converter 62 has a class D digital amplifier shown in FIG. 12. The PDM signal inputted to the D/A converter 61 or 62 is outputted as a first analog signal or a second analog signal. The first analog signal is connected to a line terminal, while the second analog signal is connected to a headphone terminal. Further, a clock generator 73 includes functions of third and fourth selecting means, generates a clock CK1 and a clock CK2, which have different frequencies, in response to the control signal CS1, and supplies the clocks CK1 and CK2 to the delta sigma modulator 51 and the D/A converters 61 and 62, respectively. For the delta sigma modulator 51, the sampling frequency can be controlled with the clock CK1, and the number of quantization levels and the order of a transfer function can be controlled with control signals CS2, CS3 and CS4 outputted from the control signal generator 72.

Furthermore, the sampling frequency of a PWM section (PWM converter) in each of the D/A converters 61 and 62 can be controlled with the clock CK2.

Next, the functions of the clock generator 73 will be described in detail below. The clock generator 73 supplies the clock CK1 and the clock CK2 to the delta sigma modulator 51 and the D/A converters 61 and 62, respectively. The sampling frequency of the delta sigma modulator 51 is determined by the clock CK1, and the over-sampling rate of the delta sigma modulator 51 can be controlled by changing this frequency. On the other hand, if the D/A converter is a PWM type D/A converter, the clock frequency (sampling frequency) of the PWM converter can be controlled (selected) with the clock CK2, and if the D/A converter is a switched capacitor D/A converter, the clock frequency of a switch of the switched capacitor can be controlled with the clock CK2.

Figure 2:
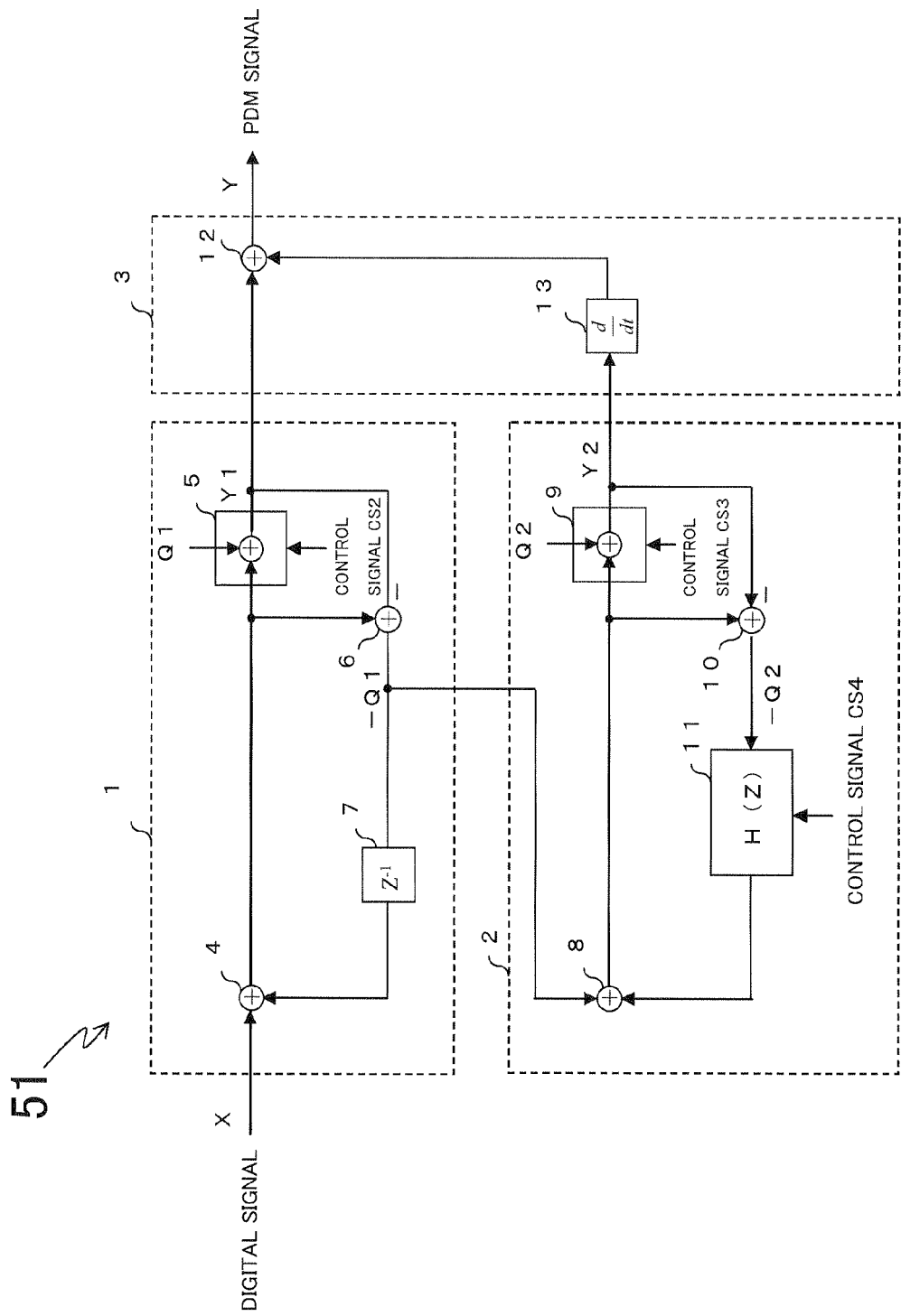
FIG. 2 is a block diagram of a delta sigma modulator shown in FIG. 1.

The functions of the control signals CS2 through CS4 supplied to the delta sigma modulator 51 including the functions of a second selecting means will be described in detail with reference to FIG. 2. The delta sigma modulator 51 includes: a main loop 1 and a sub-loop 2 operated at a sampling frequency determined by the clock CK1 supplied from the clock generator 73; and a noise removal section 3.

The main loop 1 includes an adder 4, a local quantizer 5, a subtractor 6, and a delay device 7. A digital signal X is added to a feedback signal sent via the delay device 7 by the adder 4, and is bit-compressed to a predetermined level by the local quantizer 5. The local quantizer (including the second selecting means for selecting the number of quantization levels) 5 is capable of controlling the number of quantization levels with the control signal CS2 as shown in Table 5. It should be noted that the output is standardized at 16384.

TABLE 5

| Control Signal | Local Quantizer 5 | |
| --- | --- | --- |
| CS2 | Input | Output |
| Mode 1 | 24575 or more | +2 |
|  | 8191 to 24574 | +1 |
|  | −8192 to 8191 | 0 |
|  | −24576 to −8193 | −1 |
|  | −24577 or less | −3 |
| Mode 2 | 28160 or more | +3 |
|  | 16896 to 28159 | +2 |
|  | 5632 to 16895 | +1 |
|  | −5632 to 5631 | 0 |
|  | −16896 to −5633 | −1 |
|  | −28160 to −16897 | −2 |
|  | −28161 or less | −3 |
| Mode 3 | 28678 or more | +4 |
|  | 20485 to 28678 | +3 |
|  | 12291 to 20484 | +2 |
|  | 4097 to 12290 | +1 |
|  | −4097 to 4096 | 0 |
|  | −12291 to −4098 | −1 |
|  | −20485 to −12292 | −2 |
|  | −28679 to −20486 | −3 |
|  | −28680 or less | −4 |

If a quantization error, which occurs due to the local quantizer 5, is defined as Q1, an output of the subtractor 6 becomes −Q1, and a transfer function of an output Y1 from the main loop 1 is expressed as the following equation:

$$Y1 = X + (1 - Z^{-1}) \cdot Q1$$

On the other hand, the sub-loop 2 includes an adder 8, a local quantizer 9, a subtractor 10, and an integrator 11. A signal inputted to the sub-loop 2 (=−Q1) is added to a feedback signal returned via the integrator 11 by the adder 8, and is bit-compressed to a predetermined level by the local quantizer 9. The local quantizer (including the second selecting means for selecting the number of quantization levels) 9 is capable of controlling the number of quantization levels with the control signal CS3 as shown in Table 6. It should be noted that the output is standardized at 16384.

TABLE 6

| Control Signal | Local Quantizer 9 | |
|---|---|---|
| CS3 | Input | Output |
| Mode 1 | 0 or more | +0.5 |
| | −1 or less | −0.5 |
| Mode 2 | 5632 or more | +1 |
| | −5632 to 5632 | 0 |
| | −5633 or less | −1 |

If a quantization error, which occurs due to the local quantizer 9, is defined as Q2, an output of the subtractor 10 becomes −Q2. Accordingly, if a transfer function of the integrator 11 is defined as H (Z), a transfer function of an output Y2 from the sub-loop 2 is expressed as the following equation:

$$Y2 = -Q1 + (1 - H(Z)) \cdot Q2 \quad (14)$$

The output Y2 from the sub-loop 2 is differentiated by a differentiator 13 in the noise removal section 3, and is added to the output Y1 of the main loop 1 by an adder 12. Accordingly, an output Y of the delta sigma modulator is expressed as the following equation:

$$Y = Y1 + (1 - Z^{-1}) \cdot Y2 \quad (15)$$
$$= X + (1 - Z^{-1}) \cdot (1 - H(Z)) \cdot Q2$$

If the numbers of quantization levels of the local quantizers 5 and 9 are defined as L1 and L2, respectively, while a quantization noise per unit of quantization level of the local quantizer 9 is defined as E2, then the quantization error Q2 of the local quantizer 9 is expressed as follows: Q2=E2/(L1+L2), and thus, the output Y of the delta sigma modulator is expressed as the following equation:

$$Y = X + (1 - Z^{-1}) \cdot (1 - H(Z)) \cdot E2/(L1 + L2) \quad (16)$$

Figure 3:
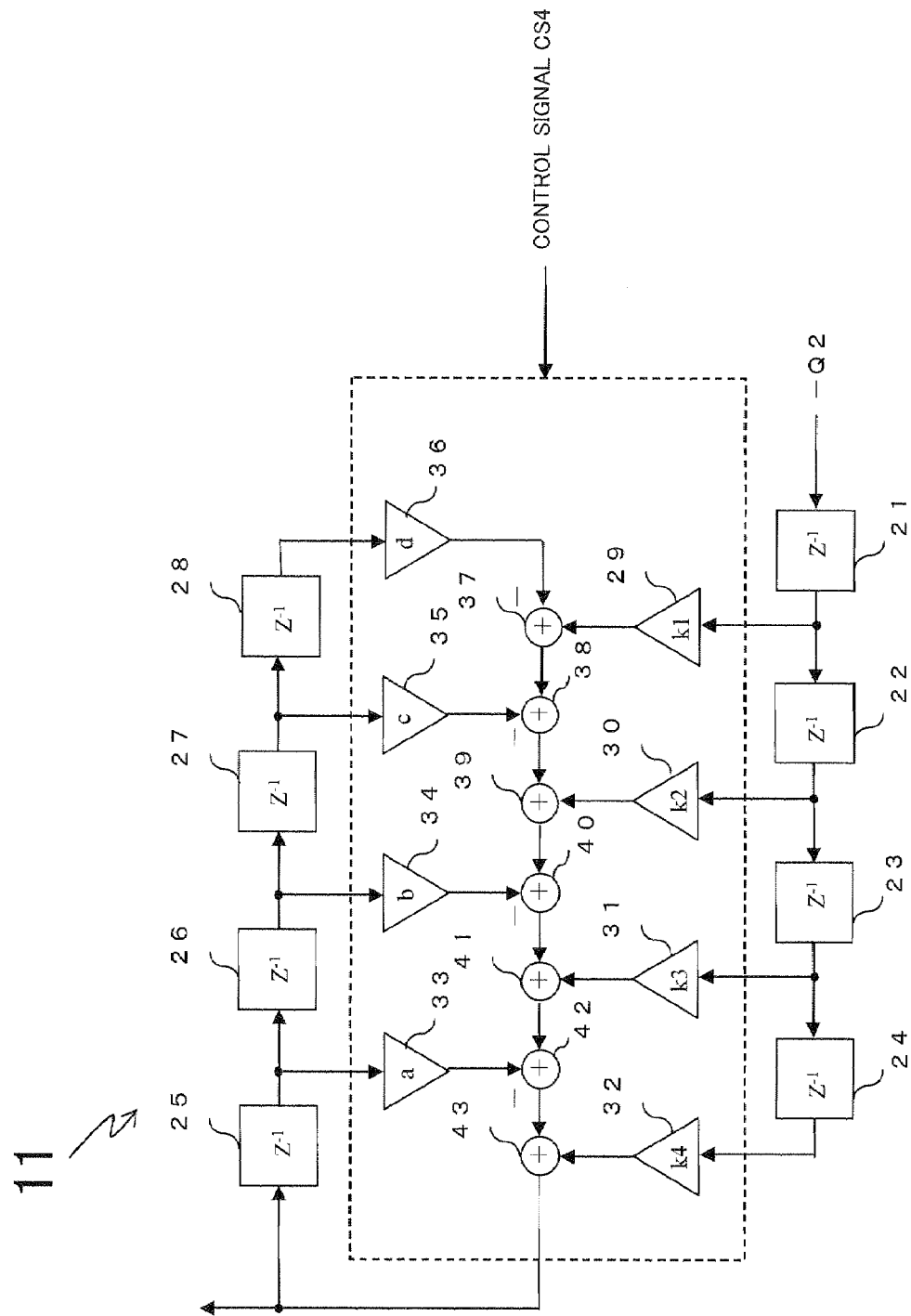
FIG. 3 is a block diagram of an integrator shown in FIG. 2.

Next, a specific configuration of the integrator 11, including the functions of the second selecting means for selecting the order of a transfer function of the delta sigma modulator, will be described below. FIG. 3 is a block diagram of the integrator 11. An input (−Q2) is supplied to a delay circuit 21, and is shifted to delay circuits 22 through 24 in sequence. Outputs of the delay circuits 21 through 24 are multiplied k1-fold, k2-fold, k3-fold and k4-fold by multipliers 29 through 32, respectively, while outputs of delay circuits 25 through 28 are multiplied a-fold, b-fold, c-fold and d-fold by multipliers 33 through 36, respectively. Then, adders 37 through 43 add the outputs of the delay circuits 21 through 24 to the outputs of the delay circuits 25 through 28, and output the resulting values, which are to be inputted to the delay circuit 25.

Therefore, the transfer function H (Z) of the integrator 11 is expressed as the following equation:

$$H(Z) = (k1 \cdot Z^{-1} + k2 \cdot Z^{-2} + k3 \cdot Z^{-3} + k4 \cdot Z^{-4})/(1 + a \cdot Z^{-1} + b \cdot Z^{-2} + c \cdot Z^{-3} + d \cdot Z^{-4}) \quad (17)$$

Consequently, the output Y of the delta sigma modulator is expressed as the following equation:

$$Y = X + (1-Z^{-1}) \cdot (1 + (a-k1) \cdot Z^{-1} + (b-k2) \cdot Z^{-2} + (c-k3) \cdot Z^{-3} + (d-k4) \cdot Z^{-4}) / ((1 + a \cdot Z^{-1} + b \cdot Z^{-2} + c \cdot Z^{-3} + d \cdot Z^{-4}) \cdot Q2 \quad (18)$$

The factors k1, k2, k3, k4, a, b, c, and d of the multipliers 29 through 36 of the integrator 11 can be controlled with the control signal CS4. The order of a transfer function of the delta sigma modulator 51 is determined by the order of the integrator 11, which means that the order of a transfer function of the delta sigma modulator can be selected with the control signal CS4. Table 7 shows the exemplary relationships between the settings for the control signal CS4 and the respective factors, shown in FIG. 3, and the order of a transfer function of the delta sigma modulator.

TABLE 7

| Control Signal | Factor | | | | | | | | Delta Sigma |
|---|---|---|---|---|---|---|---|---|---|
| CS4 | a | b | c | d | k1 | k2 | k3 | K4 | Order |
| Mode 1 | 0 | 0 | 0 | 0 | 2 | −1 | 0 | 0 | 3 |
| Mode 2 | −1 | 0.5 | 0 | 0 | 2 | −2.5 | 1 | 0 | 4 |
| Mode 3 | −2 | 2 | 0 | 0 | 2 | −4 | 4 | −1 | 5 |

As already described above, a D/A converting system intended for digital audio equipment, in particular portable equipment, is often required to output two types of analog audio signals to two terminals, i.e., a line terminal and a headphone terminal. Therefore, in the system shown in FIG. 1, a class AB amplifier, shown in FIG. 11 and suitable for a line terminal, is used in an amplifier section of the D/A converter 61, while a class D amplifier, shown in FIG. 12 and suitable for a headphone terminal, is used in the D/A converter 62.

Further, the line terminal and the headphone terminal are not simultaneously used; therefore, when the line terminal is used, first, the selector 71 makes a selection so that a PDM signal is outputted to the D/A converter 61. In this case, the input to the D/A converter 62 is fixed at 0. At the same time, due to the control signals CS1 through CS4, the over-sampling rate and the order of a transfer function of the delta sigma modulator are set to be high, while the numbers of quantization levels of the local quantizers 5 and 9 are set to be small. Consequently, if the over-sampling rate is set at 32 times, the order of a transfer function of the delta sigma modulator is set at 3, and the numbers of quantization levels of the local quantizers 5 and 9 are set at 7-value and 3-value, respectively, for example, then a dynamic range of about 100 dB can be realized as a theoretical value.

On the other hand, when the headphone terminal is used, first, the selector 71 makes a selection so that a PDM signal is outputted to the D/A converter 62. In this case, the input to the D/A converter 61 is fixed at 0. Further, due to the control signals CS1 through CS4, the numbers of quantization levels of the local quantizers 5 and 9 are set to be high while the over-sampling rate is set so that the clock frequency of the PWM signal becomes 10 MHz or less in accordance with the required percentage modulation. Consequently, if the numbers of quantization levels of the local quantizers 5 and 9 are set at 9-value and 3-value, respectively, the over-sampling rate is set at 16 times, and the order of the transfer function is set at 4, for example, then a percentage modulation of 67% and a dynamic range of 90 dB are obtained.

Based on the above results, the configuration of the present invention is provided to select, in accordance with the selected D/A converter, the number of quantization levels, the sampling frequency, and the order of a transfer function of the delta sigma modulator, thus enabling the generation of a delta sigma modulated signal optimal for the selected D/A converter. Accordingly, the present embodiment can implement a delta sigma modulation D/A converting system capable of improving the performance of an amplifier output signal.

Moreover, the sampling frequency of the PWM converter is determined in proportion to the product of the sampling frequency and the number of quantization levels of the delta sigma modulator. Therefore, the adoption of the configuration for selecting the sampling frequency of the PWM converter makes it possible to change the number of quantization levels while the sampling frequency of the delta sigma modulator is kept constant.

Embodiment 2

Figure 4:
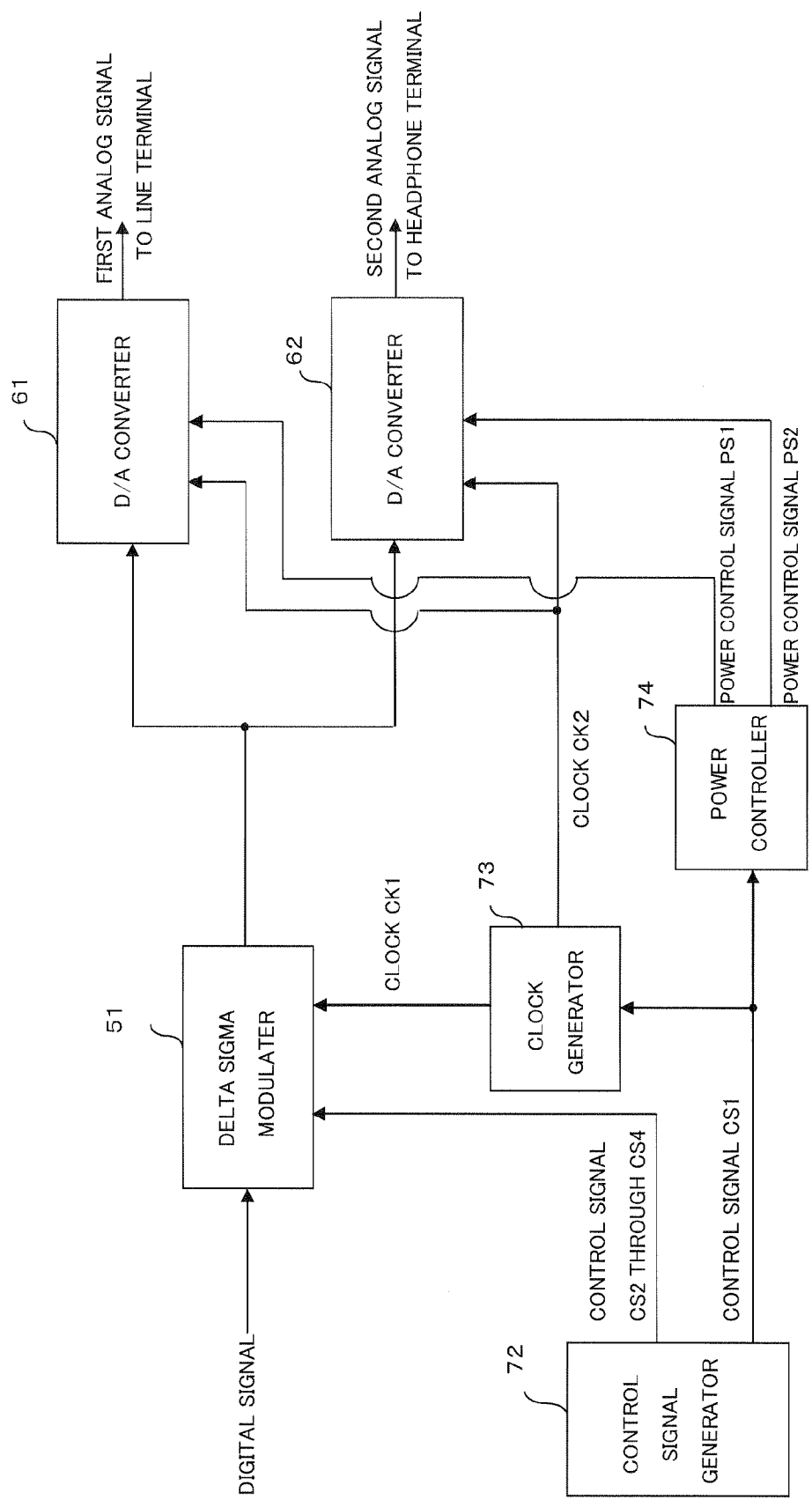
FIG. 4 is a block diagram of a delta sigma modulation D/A converting system according to Embodiment 2 of the present invention.

FIG. 4 shows Embodiment 2 of the present invention. A digital signal is inputted to a delta sigma modulator 51, and is modulated into a PDM signal. The PDM signal is inputted to a D/A converter 61 and a D/A converter 62, and the D/A converters 61 and 62 output first and second analog signals, respectively. The first analog signal is connected to a line terminal, while the second analog signal is connected to a headphone terminal. Further, a clock generator 73 generates a clock CK1 and a clock CK2, which have different frequencies, in response to a control signal CS1, and supplies the clocks CK1 and CK2 to the delta sigma modulator 51 and the D/A converters 61 and 62, respectively. The sampling frequency of the delta sigma modulator 51 can be controlled with the clock CK1, and furthermore, the number of quantization levels and the order of a transfer function can be controlled with control signals CS2, CS3 and CS4 outputted from a control signal generator 72. Moreover, the circuit operations of the D/A converters 61 and 62 are controlled in accordance with power control signals PS1 and PS2, which are outputted from a power controller 74 controlled with the control signal CS1. Specifically, when the line terminal is used, the D/A converter 61 is caused to enter an operating state, and the operation of the unused D/A converter 62 is stopped, thereby making it possible to suppress current consumption. The above-mentioned power controller 74 includes a logic circuit operated with logics shown in Table 8 below.

TABLE 8

| Control Signal CS1 | Output | |
| --- | --- | --- |
|  | PS1 | PS2 |
| L | L | H |
| H | H | L |

Figure 5:
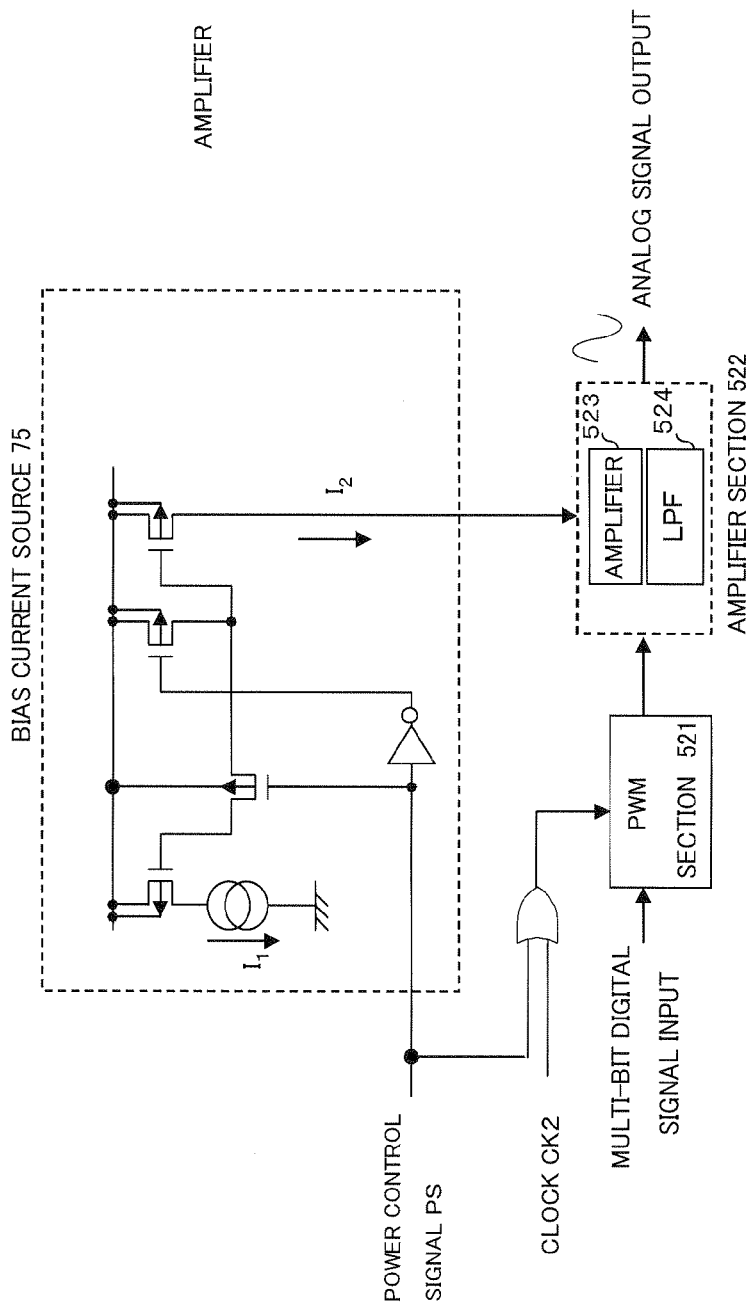
FIG. 5 is a block diagram of a D/A converter having a power control function.
Figure 6:
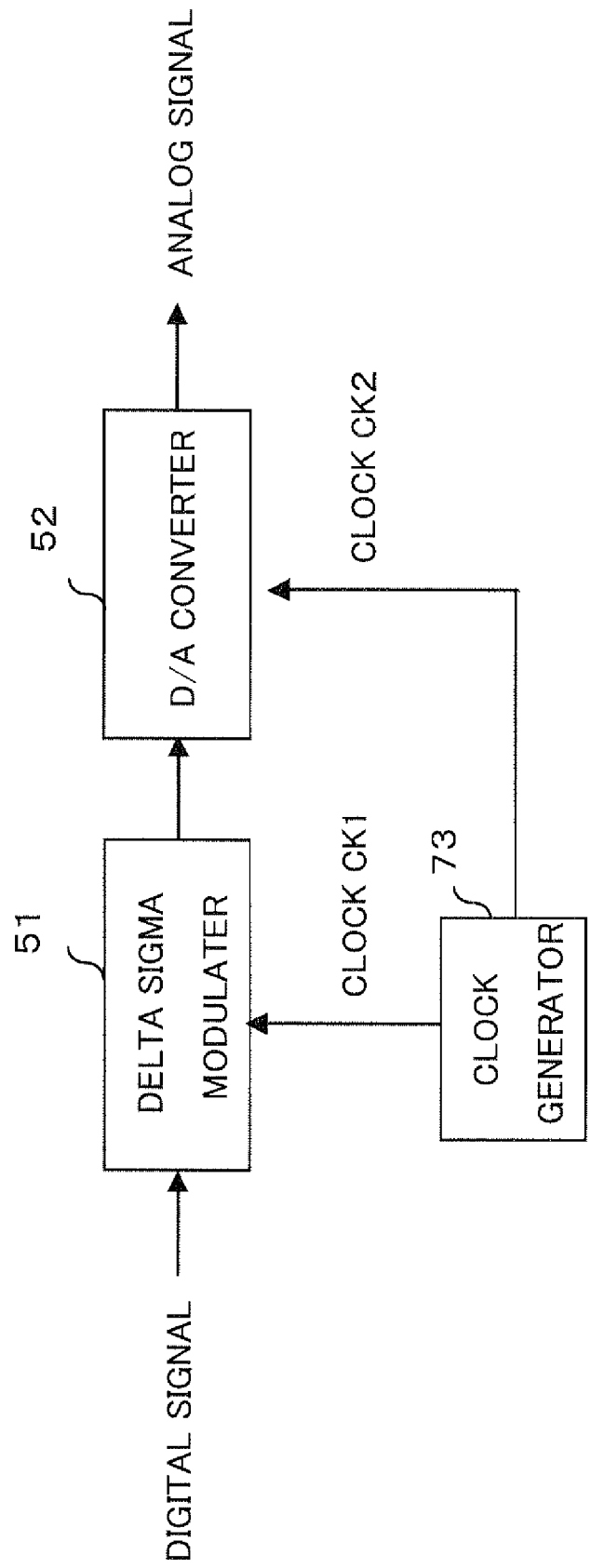
FIG. 6 is a block diagram of a conventional delta sigma modulation D/A converting system.
Figure 7:
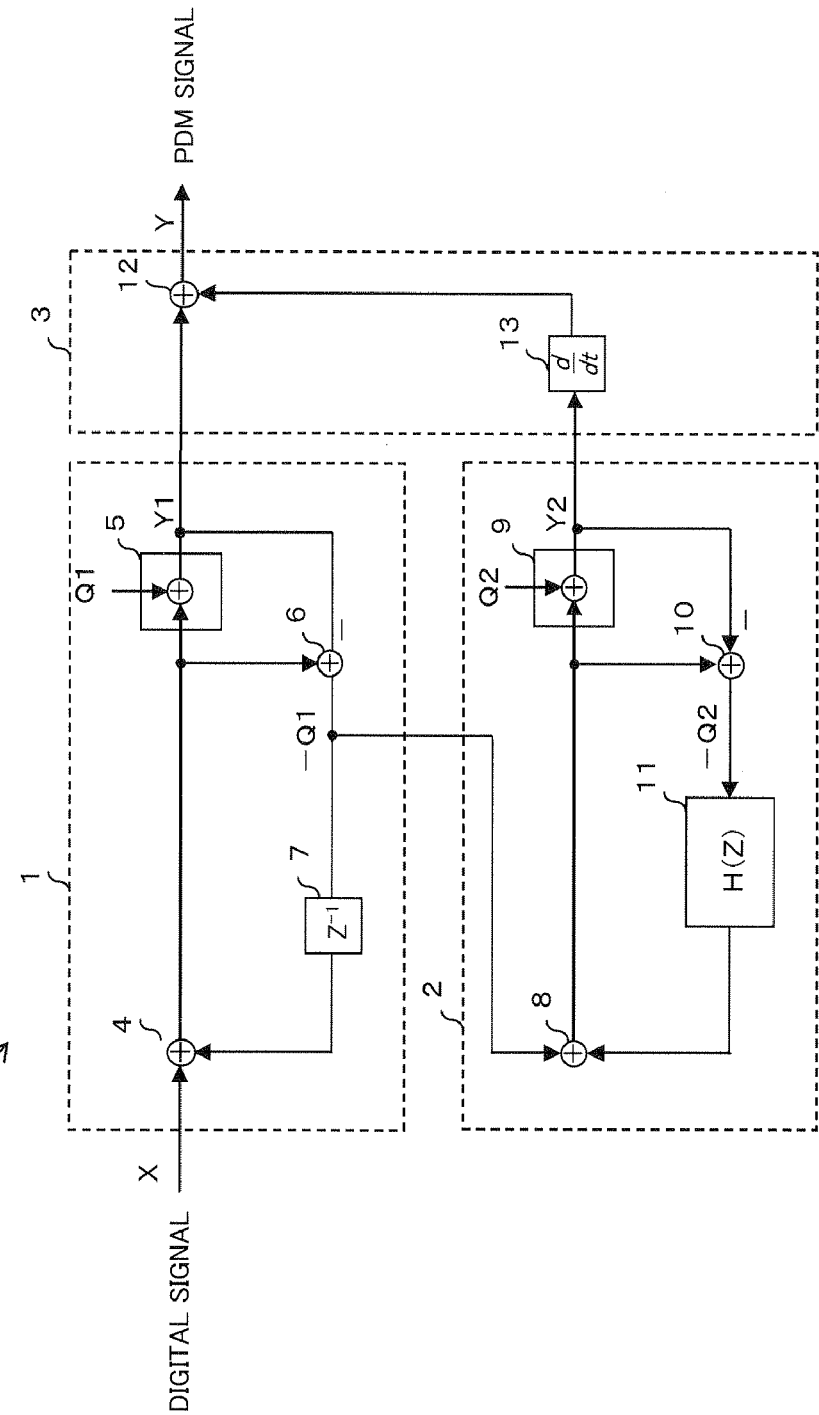
FIG. 7 is a block diagram of a delta sigma modulator shown in FIG. 6.
Figure 8:
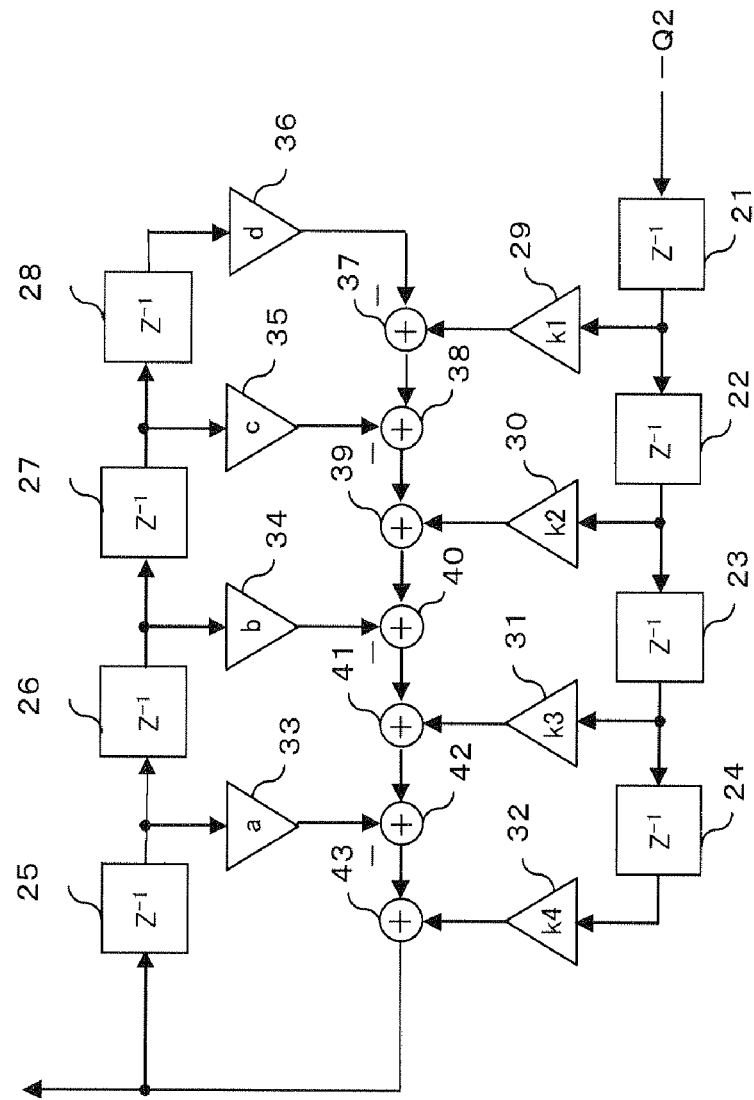
FIG. 8 is a block diagram of an integrator shown in FIG. 7.
Figure 9:
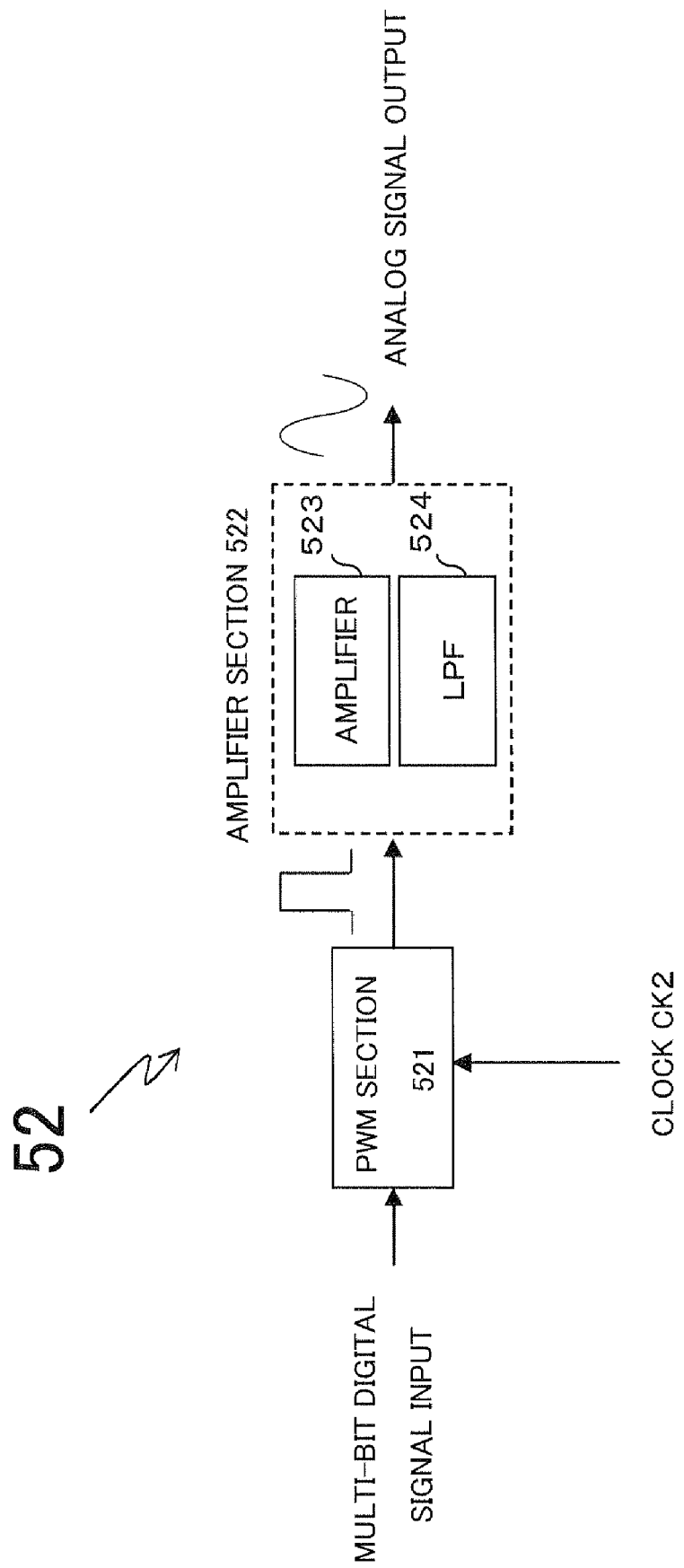
FIG. 9 is a block diagram of a D/A converter.
Figure 10:
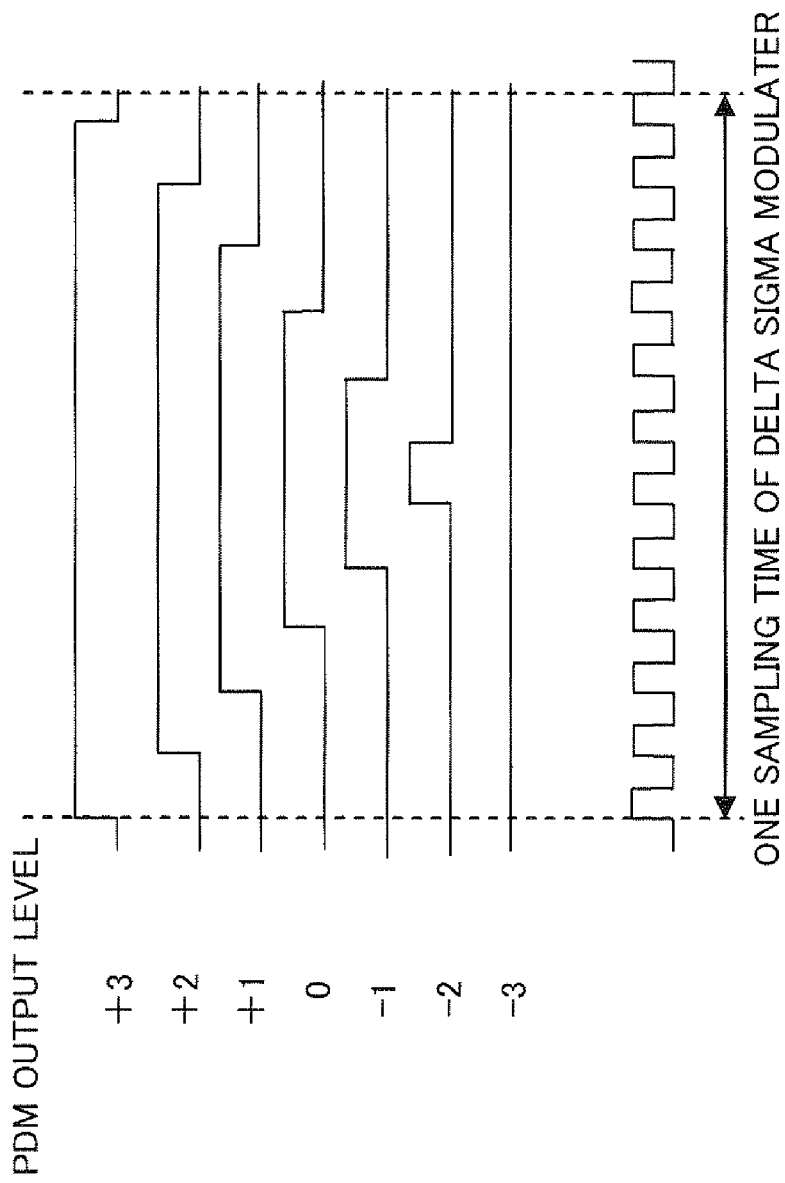
FIG. 10 is a chart for describing an operation of a PWM section used in FIG. 9.

Referring now to FIG. 5, the power control operation of the D/A converter will be described in detail. A clock CK2 to a PWM section 521 can be controlled with a power control signal PS (PS1 or PS2). More specifically, when the power control signal PS is at a "high level", the clock CK2 is supplied to the PWM section 521 as it is; on the other hand, when the power control signal PS is at a "low level", the clock CK2 to the PWM section 521 is also fixed at a "low level". Further, since an amplifier section 522 is formed by an analog circuit, a bias current source 75 supplies a bias current to the amplifier section 522. Thus, when the power control signal PS is at a high level, a bias current is supplied to the amplifier section 522; on the other hand, when the power control signal PS is at a low level, no bias current is supplied to the amplifier section 522. Accordingly, when the D/A converter is desired to be operated, a "high level" power control signal is inputted; on the other hand, when the operation of the D/A converter is desired to be stopped, a "low level" power control signal is inputted, thereby making it possible to eliminate the bias current for the unused D/A converter, and to suppress current consumption.

According to this embodiment, in addition to the effects similar to those of Embodiment 1, the effect of enabling the suppression of current consumption can be achieved.

It should be noted that, although the D/A converters 61 and 62 are shown in the drawings on a one-by-one basis in each of the foregoing embodiments, a configuration provided with the two or more selectable D/A converters 61 and the two or more selectable D/A converters 62 may alternatively be used.

INDUSTRIAL APPLICABILITY

The present invention relates to a delta sigma modulation D/A converting system including a delta sigma modulator and a plurality of D/A converters. The present invention achieves the effects of enabling the implementation of the delta sigma modulation D/A converting system in which the number of quantization levels, the sampling frequency, or the order of a transfer function of the delta sigma modulator is selected in accordance with the selected D/A converter, thereby making it possible to generate a delta sigma modulated signal optimal for an amplifier configuration of the selected D/A converter, and to improve the performance of an amplifier output signal. Thus, the present invention is useful as a signal processing means such as a D/A converting system intended for digital audio equipment.

What is claimed is:

1. A delta sigma modulation D/A converting system comprising:
    a delta sigma modulator that has a quantizer for quantizing a signal, in which the number of quantization levels is selectable, and that is operated at a predetermined sampling frequency;
    at least one first D/A converter that has a linear amplifier, and that receives an output of the delta sigma modulator;
    at least one second D/A converter that has a digital amplifier, and that receives an output of the delta sigma modulator;
    first selecting means for selectively activating one of the at least one first D/A converter and the at least one second D/A converter; and
    second selecting means for selecting the number of quantization levels of the quantizer in conjunction with the first selecting means.

2. The delta sigma modulation D/A converting system according to claim 1,
    the system further comprising third selecting means for selecting the sampling frequency of the delta sigma modulator in conjunction with the first selecting means.

3. The delta sigma modulation D/A converting system according to claim 1,
    wherein the at least one first D/A converter and the at least one second D/A converter each have a PWM converter operated at a predetermined sampling frequency, and
    wherein the system further comprises fourth selecting means for selecting the sampling frequency of the PWM converter in conjunction with the first selecting means.

4. The delta sigma modulation D/A converting system according to claim 2, wherein the at least one first D/A converter and the at least one second D/A converter each have a PWM converter operated at a predetermined sampling frequency, and wherein the system further comprises fourth selecting means for selecting the sampling frequency of the PWM converter in conjunction with the first selecting means.

5. The delta sigma modulation D/A converting system according to claim 1, wherein the first selecting means comprises of a selector for selectively supplying an output of the delta sigma modulator to one of the at least one first D/A converter and the at least one second D/A converter.

6. The delta sigma modulation D/A converting system according to claim 1, wherein the first selecting means comprises of a power controller for supplying an operating bias current to one of the at least one first D/A converter and the at least one second D/A converter, and for stopping the supply of the bias current to the other D/A converter(s).

7. A delta sigma modulation D/A converting system comprising:

a delta sigma modulator that allows the order of a transfer function to be selectable, and that is operated at a predetermined sampling frequency;

at least one first D/A converter that has a linear amplifier, and that receives an output of the delta sigma modulator;

at least one second D/A converter that has a digital amplifier, and that receives an output of the delta sigma modulator;

first selecting means for selectively activating one of the at least one first D/A converter and the at least one second D/A converter; and second selecting means for selecting the order of a transfer function of the delta sigma modulator in conjunction with the first selecting means.

8. The delta sigma modulation D/A converting system according to claim 7, the system further comprising third selecting means for selecting the sampling frequency of the delta sigma modulator in conjunction with the first selecting means.

9. The delta sigma modulation D/A converting system according to claim 7, wherein the at least one first D/A converter and the at least one second D/A converter each have a PWM converter operated at a predetermined sampling frequency, and wherein the system further comprises fourth selecting means for selecting the sampling frequency of the PWM converter in conjunction with the first selecting means.

10. The delta sigma modulation D/A converting system according to claim 8, wherein the at least one first D/A converter and the at least one second D/A converter each have a PWM converter operated at a predetermined sampling frequency, and wherein the system further comprises fourth selecting means for selecting the sampling frequency of the PWM converter in conjunction with the first selecting means.

11. The delta sigma modulation D/A converting system according to claim 7, wherein the first selecting means comprises of a selector for selectively supplying an output of the delta sigma modulator to one of the at least one first D/A converter and the at least one second D/A converter.

12. The delta sigma modulation D/A converting system according to claim 7, wherein the first selecting means comprises of a power controller for supplying an operating bias current to one of the at least one first D/A converter and the at least one second D/A converter, and for stopping the supply of the bias current to the other D/A converter(s).

\* \* \* \* \*